(12) United States Patent
Kim et al.

(10) Patent No.: US 7,829,445 B2
(45) Date of Patent: Nov. 9, 2010

(54) METHOD OF MANUFACTURING A FLASH MEMORY DEVICE

(75) Inventors: Tae-Whan Kim, Seoul (KR); Jae-Hun Jung, Seoul (KR); Jae-Won Shin, Daejeon (KR); Jeong-Yong Lee, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/289,301

(22) Filed: Oct. 24, 2008

(65) Prior Publication Data

US 2010/0105178 A1    Apr. 29, 2010

(51) Int. Cl.
*H01L 21/20* (2006.01)

(52) U.S. Cl. ........................ 438/487; 438/104; 438/288; 438/593; 257/E21.18; 257/E21.333; 257/E21.68; 977/721; 977/773

(58) Field of Classification Search ................. 438/288, 438/293; 977/720, 721, 785; 257/E21.179, 257/E21.18, E21.183, E21.187, E21.189, 257/E21.328, E21.33, E21.333
See application file for complete search history.

(56) References Cited

U.S. PATENT DOCUMENTS

2002/0074565 A1* 6/2002 Flagan et al. ............... 257/200
2002/0106850 A1* 8/2002 Iguchi et al. ................ 438/218

FOREIGN PATENT DOCUMENTS

| KR | 10-0550452 | 2/2006 |
| KR | 10-2006-0070866 | 6/2006 |
| KR | 10-2006-0113081 | 11/2006 |
| KR | 10-0736850 | 7/2007 |
| WO | WO 2004/010508 | 1/2004 |

* cited by examiner

*Primary Examiner*—Charles D Garber
*Assistant Examiner*—Cheung Lee
(74) *Attorney, Agent, or Firm*—Harness, Dickey & Pierce (57) ABSTRACT

Provided may be a method of fabricating a flash memory device having metal nano particles. The method of manufacturing a flash memory device may include forming a metal oxide thin layer on a semiconductor substrate, forming a floating gate of an amorphous metal silicon oxide thin layer by performing a thermal treatment process on the semiconductor substrate where the metal oxide thin layer is formed, and forming metal nano particles in the floating gate by projecting an electron beam on the floating gate, the metal nano particles being surrounded by a silicon oxide layer.

18 Claims, 7 Drawing Sheets

METHOD OF MANUFACTURING A FLASH MEMORY DEVICE

BACKGROUND

1. Field

Example embodiments relate to a method of manufacturing a flash memory device, and more particularly, to a method of forming metal nano particles in a floating gate by projecting an electron beam in a flash memory device.

2. Description of the Related Art

Flash memory devices may be mainly classified into a NOR-type structure and a NAND-type structure, where cells between a bit line and ground line may be arranged in parallel and in series, respectively. The NOR-type structure may be further divided into an AND type, a DINOR type, and a virtual ground array type (VGA), all of which may be a modification of the NOR-type structure. The NOR-type structure may be based on an EPROM tunnel oxide (ETOX) method that uses an erasable programmable read-only memory (EPROM) cell structure.

SUMMARY

Example embodiments provide a method of manufacturing a flash memory device including metal nano particles formed by projecting an electron beam in an amorphous metal silicon oxide thin layer. Example embodiments also provide a method of manufacturing a flash memory device capable of controlling the size, concentration, and position of metal nano particles by appropriately adjusting the size, projection time, and projection position of an electron beam during the manufacture of a floating gate.

Example embodiments also provide a method of manufacturing a flash memory device including metal nano particles having improved charge trap ability on its surface, because metal nano particles may be surrounded by an insulation layer. Example embodiments also provide a method of manufacturing a flash memory device that may be used in a disk type storage device, and a high capacity storage device of a portable electronic device, e.g, mobile phones or PMPs.

In example embodiments, a method of manufacturing a flash memory device may include forming a metal oxide thin layer on a semiconductor substrate, forming a floating gate of an amorphous metal silicon oxide thin layer by performing a thermal treatment process on the semiconductor substrate where the metal oxide thin layer may be formed, and forming metal nano particles in the floating gate by projecting an electron beam on the floating gate, the metal nano particles being surrounded by a silicon oxide layer.

The method may further include forming a first conductive region and a second conductive region at both sides of the floating gate. In example embodiments, the amorphous metal silicon oxide thin layer may be formed between the semiconductor substrate and the metal oxide thin layer. In example embodiments, the method may further include etching the metal oxide thin layer. In example embodiments, the method may further include forming an insulation layer on the floating gate.

In example embodiments, the method may further include forming a gate electrode, a first electrode, and a second electrode on the floating gate, the first conductive region, and the second conductive region, respectively. In example embodiments, the metal nano particles being surrounded by the silicon oxide layer may be generated by separating the metal nano particles and the silicon oxide layer in the amorphous metal silicon oxide thin layer.

In example embodiments, a metal of the metal nano particles may include at least one of zinc (Zn), copper (Cu), indium (In), silver (Ag), tin (Sn), antimony (Sb), nickel (Ni), and iron (Fe). In example embodiments, size, concentration, and position of the metal nano particles may be controlled by respectively adjusting focal size, projection time, and projection position of the electron beam. In example embodiments, a thickness of the floating gate may be controlled by adjusting the thermal treatment time. In example embodiments, the amorphous metal silicon oxide thin layer may be formed between the semiconductor substrate and the metal oxide thin layer. In example embodiments, the amorphous metal silicon oxide thin layer may include at least one thin layer of $Zn_{2x}Si_{1-y}O_2$, $Cu_{2x}Si_{1-y}O_2$, $In_{2x}Si_{1-y}O_2$, $Ag_{2x}Si_{1-y}O_2$, $Sn_{2x}Si_{1-y}O_2$, $Sb_{2x}Si_{1-y}O_2$, $Ni_{2x}Si_{1-y}O_2$, and $Fe_{2x}Si_{1-y}O_2$.

In example embodiments, the metal oxide thin layer may be formed by sputtering, evaporation, molecular bean epitaxy (MBE), ionized cluster beam deposition (ICBD), or a laser deposition method. In example embodiments, the thickness of the amorphous metal silicon oxide thin layer may be about 15 nm-about 20 nm. In example embodiments, forming the first and second conductive regions may include implanting ions of Group V elements at both sides of the floating gate, the Group V element is phosphorous (P), and the ions are implanted by a high energy ion implanting method, a low energy ion implanting method, an ion method controlling the impurity implanted depth through a heavy atom, or a plasma ion implanting method.

BRIEF DESCRIPTION OF THE FIGURES

Example embodiments will be more clearly understood from the following detailed description taken in conjunction with the accompanying drawings. FIGS. 1-11 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will be described more fully hereinafter with reference to the accompanying drawings, in which example embodiments are shown. Example embodiments may, however, be embodied in different forms and should not be construed as limited to example embodiments set forth herein. Rather, example embodiments are provided so that this disclosure will be thorough and complete, and will fully convey the scope of example embodiments to those skilled in the art. In the drawings, the thickness of layers and regions are exaggerated for clarity. Like numbers refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. For convenience of description, a first electrode may be called a source electrode and a second electrode may be called a drain electrode.

Figure 1:
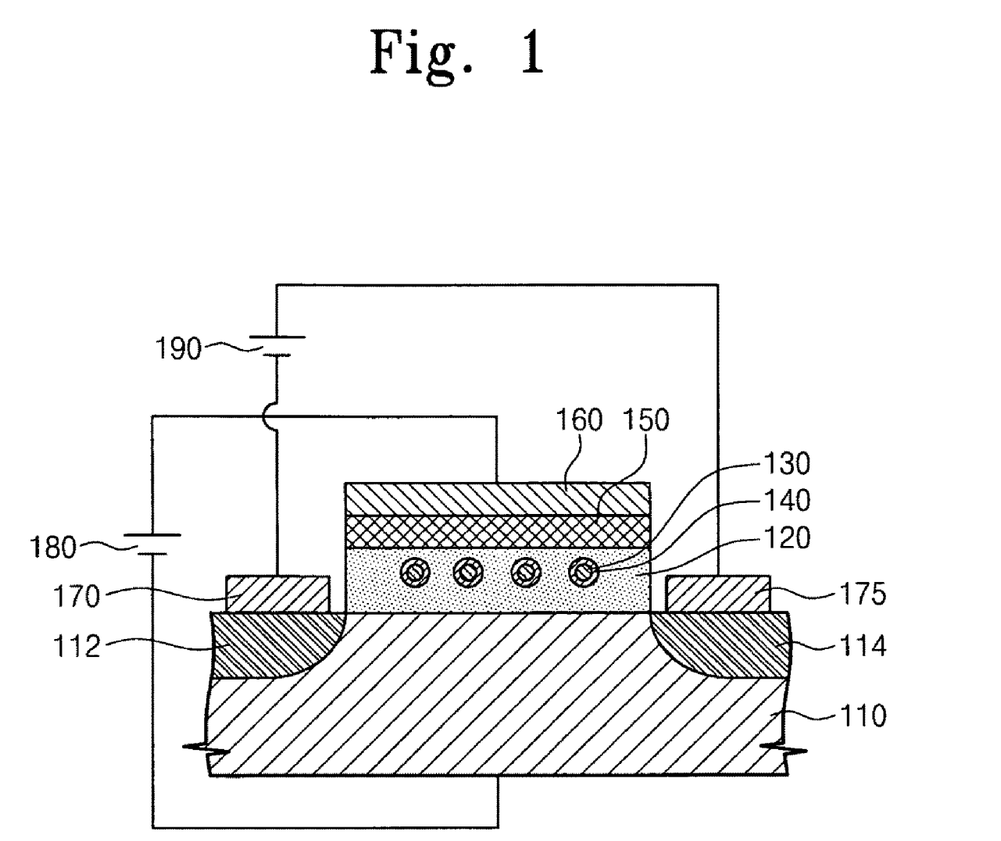
FIG. 1 is a view illustrating a structure of a flash memory device according to example embodiments.

FIG. 1 is a view illustrating a structure of a flash memory device according to example embodiments. Referring to FIG. 1, the flash memory device may include a semiconductor substrate 110, a floating gate 120, a gate electrode 160, a source electrode 170, and a drain electrode 175. The semiconductor substrate 110 may include a source region 112 and a drain region 114. The floating gate 120 may be an amorphous metal silicon oxide thin layer where metal nano particles 130 are distributed therein. The source electrode 170 may be formed on the source region 112, and the drain electrode 175 may be formed on the drain region 114.

In example embodiments, the gate electrode 160 may be connected to the semiconductor substrate 110 through a first voltage source 180, and the source electrode 170 may be connected to the drain electrode 175 through a second voltage source 190. The gate electrode 160, the source electrode 170, and the drain electrode 175 may be typical components of a flash memory device, and thus, a detailed description will be omitted.

A silicon (Si) substrate for a general semiconductor device may be used for the semiconductor substrate 110, and the source region 112 and the drain region 114 may be formed by doping a predetermined or given portion of the semiconductor substrate 110. For example, if a P-type silicon substrate is used as the semiconductor substrate 110, each region at both sides of the floating gate 120 may be doped with Group V elements (e.g., phosphorus (P)) such that the N-type source region 112 and drain region 114 may be formed.

The source region 112 corresponding to a first conductive region may supply electrons or holes, and the electrons or holes may pass through a channel region (not shown) in the semiconductor substrate 110. The electrons or holes may pass through the channel region and may escape through the floating gate 120 at the drain region 114 corresponding to the second conductive region.

The floating gate 120 may be an amorphous metal silicon oxide thin layer, and may serve as a storage space preventing or reduce electrons trapped in the metal nano particles 130 from escaping to the external environment The electron may be trapped in the metal nano particle 130 by applying a write voltage to the flash memory device In example embodiments, the floating gate 120 may be formed on a region (hereinafter, referred to as an intermediate region) between the source region 112 and the drain region 114 of the semiconductor substrate 110.

Figure 9:
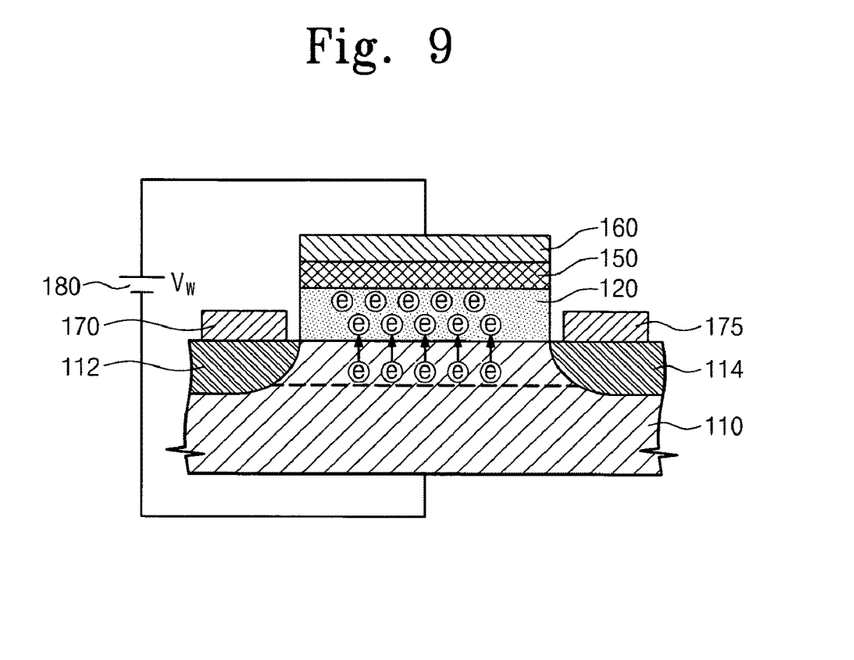
FIG. 9 is a view illustrating a principal of a write operation in a flash memory device according to example embodiments.
Figure 11:
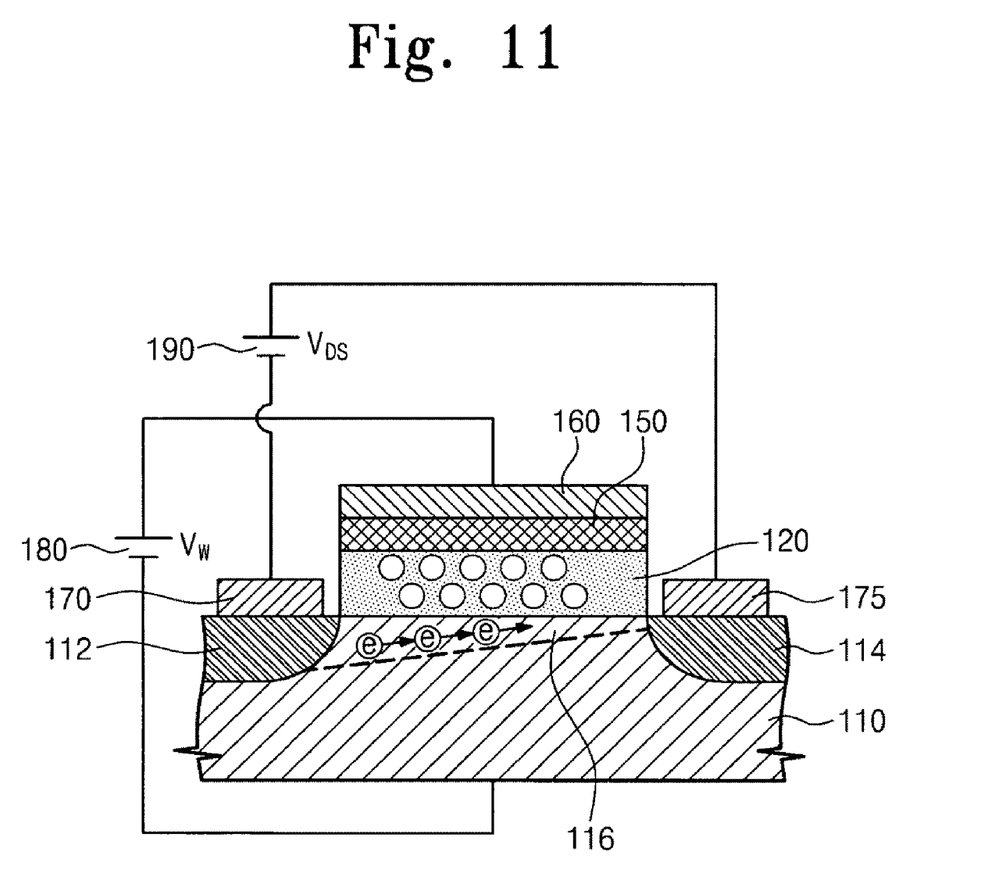
FIG. 11 is a view illustrating a principal of a read operation of a state '0' in a flash memory device according to example embodiments.

The reason that the amorphous metal silicon oxide thin layer may be formed on the intermediate region is that the channel may be formed as electrons flow through the intermediate region according to a voltage applied to a memory device (refer to FIG. 9 or FIG. 11). Accordingly, a position where the floating gate 120 is formed may vary based on a predetermined or given position where a channel is formed in the semiconductor substrate 110 according to a voltage. The floating gate 120 may use an amorphous thin layer (a $Zn_{2X}Si_{1-Y}O_2$ thin layer, where X and Y may be a decimal number between 0 and 1) of a metal silicon oxide formed of components of zinc (Zn), silicon (Si), and oxygen (O). This thin layer may be formed through mutual diffusion between materials during a heat treatment process.

For example, after a metal oxide thin layer (e.g., a ZnO thin layer) is formed on the semiconductor substrate 110, a predetermined or given heat treatment process may be performed, and thus, an amorphous $Zn_{2X}Si_{1-Y}O_2$ thin layer where an zinc (Zn) nano particle may be distributed at an interface between the semiconductor substrate 110 and the metal oxide thin layer may be formed through mutual diffusion between materials. This will be clarified through a manufacturing process of FIG. 2.

The metal nano particles 130 may be distributed in the amorphous metal silicon oxide thin layer such that they may serve mainly for trapping electrons. Electrons may transfer through a channel formed at a predetermined or given region of the semiconductor substrate 110 according to a write voltage applied to the flash memory device of example embodiments. The metal may be zinc (Zn), copper (Cu), indium (In), silver (Ag), tin (Sn), antimony (Sb), nickel (Ni), and ion (Fe).

Additionally, the metal nano particles 130 may be about 1 nm-about 20 nm, for example, about 5 nm to about 10 nm, or for example, about 7 nm. The size and concentration of the metal nano particles 130 may be accurately controlled by adjusting the focal size, and projection time of an electron beam.

The metal nano particles 130 of example embodiments may be surrounded by a silicon oxide 140 of an insulation layer, and the silicon oxide 140 may prevent or reduce electrons trapped in the metal nano particles 130 from draining. A description for a crystallized form of the metal nano particles 130 and electrons trapped in the metal nano particles 130 will be made with reference to FIGS. 3-6.

A silicon oxide thin layer corresponding to the insulation layer 150 may be further stacked on the amorphous metal silicon oxide thin layer 120 of example embodiments. Leakage of electrons trapped in the amorphous metal silicon oxide thin layer 120 may be prevented or reduced by stacking the insulation layer 150.

Figure 2:
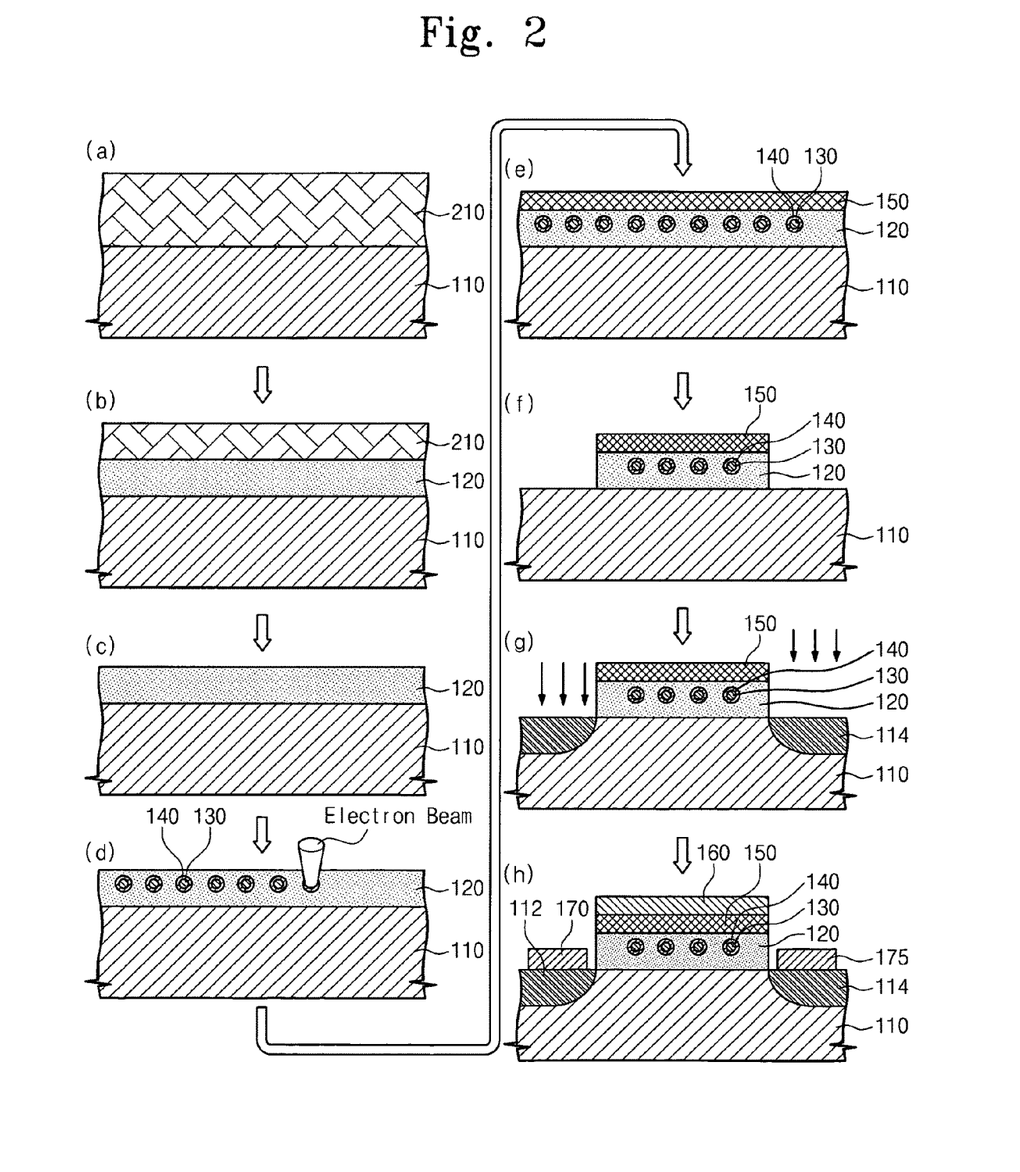
FIG. 2 is a view illustrating a manufacturing process of a flash memory device according to example embodiments.

FIG. 2 is a view illustrating a manufacturing process of a flash memory device according to example embodiments.

Although not illustrated, a semiconductor substrate 110 may be doped with an impurity. Impurities, e.g., dust and oiliness of the surface of the semiconductor substrate 110, may be removed, and a process for cleaning the semiconductor substrate 110 may precede other processes. For example, the semiconductor substrate 110 may be cleaned through deionized water after an impurity is removed with a trichloroethylene (TCM) solution on the surface of a P-type silicon (Si) substrate where boron (B) may be doped with a concentration of about $1 \times 10^{15}$ $cm^{-3}$.

As illustrated in (a) of FIG. 2, a metal oxide thin layer 210 may be deposited on the semiconductor substrate 110. For example, after a silicon (Si) substrate is mounted in a vacuum chamber filled with argon (Ar) gas of the vacuum degree of about $1 \times 10^{-7}$ torr and the purity degree of about 99.9999%, a metal oxide thin layer 210 (e.g., a ZnO thin layer) may be deposited on the silicon (Si) substrate.

Depositing the thin layer 210 may be completed through a physical deposition method, e.g., sputtering, evaporation, molecular bean epitaxy (MBE), ionized cluster beam deposition (ICBD), or a laser deposition. For example, if a ZnO thin layer is grown using a radio frequency (RF) sputtering method, the frequency of sputter equipment may be set with about 13.26 MHz and its output may be set with about 100 W.

There may be no specific limitation about the thickness of the growing metal oxide thin layer 120, but the thickness may be about 30 nm in order to obtain the thickness of the amorphous metal silicon oxide thin layer (e.g., a $Zn_{2X}Si_{1-Y}O_2$ thin layer) that will be formed. In example embodiments, the thickness of the formed amorphous metal silicon oxide thin layer may be about 15 nm-about 20 nm, e.g., about 15 nm. For example, if a temperature of about 250° C. and a pressure of about $1.2 \times 10^{-2}$ torr is applied to the silicon (Si) substrate 110, a ZnO thin layer may grow at about 13 nm per minute.

While the metal oxide thin layer 210 is deposited on the semiconductor substrate 110, a silicon oxide thin layer may be naturally formed. For example, when a ZnO thin layer is formed on a silicon (Si) substrate through a sputtering process, a $SiO_x$ thin layer having the thickness of about 2 nm may be formed. Silicon (Si) in the substrate and oxygen ions may be mutually combined during the sputtering process to form the $SiO_x$ thin layer. Referring to (b) of FIG. 2, silicon (Si) of the semiconductor substrate 110 where the metal oxide thin layer 210 is deposited may be heat-treated, such that a floating gate 120, e.g., an amorphous metal silicon oxide thin layer, may be formed.

Heat treatment may be performed, for example, for about 20 minutes at a temperature of about 900° C. by using a heat source of a tungsten-halogen lamp under an $O_2$ environment, and as this heat treatment process proceeds, mutual diffusion between materials may occur at an interface between the semiconductor substrate 110 and the metal oxide thin layer 210. Setting conditions (e.g., temperature condition and time condition) for the heat treatment process may not be limited to the above-mentioned conditions. Additionally, each embodiment given for describing example embodiments may be merely one example for convenience of description and understanding, and does not limit the rights coverage of example embodiments.

For example, if a silicon (Si) substrate having the grown ZnO thin layer is heat-treated through the above-mentioned conditions, due to mutual diffusion between materials (e.g., silicon, zinc, and oxygen), a silicon oxide layer (a $SiO_2$ layer) may grow at the interface close to the silicon substrate and an amorphous $Zn_{2X}Si_{1-Y}O_2$ (a-$Zn_{2X}Si_{1-Y}O_2$) thin layer 120 where Zn nano particles are distributed therein may grow at the interface close to the ZnO thin layer according to the position.

In example embodiments, the silicon oxide layer growing at the interface close to the silicon substrate may function as a tunnel insulation layer used for electrical insulation between the semiconductor substrate 110 and the floating gate 120 in the flash memory device of example embodiments. The thickness of the floating gate 120 may be diversely formed by adjusting a thermal treatment time. For example, the $SiO_X$ thin layer having the thickness of about 2 nm at the beginning of the process may become an amorphous $Zn_{2X}Si_{1-Y}O_2$ thin layer having a thickness of about 15 nm to about 20 nm.

Referring to (c) of FIG. 2, after forming the floating gate 120 having a targeted thickness, the metal oxide thin layer 210 formed thereon may be removed through an etching process. Referring to an operation (d) of FIG. 2, metal nano particles 130 may be formed by projecting an electron beam on the floating gate 120 of an amorphous metal silicon oxide thin layer. For example, by adjusting the focus of the electron beam to about 7 nm, the electron beam may be projected for about 5 seconds on the $Zn_{2X}Si_{1-Y}O_2$ thin layer with an energy of about 300 KeV, and a Zn nano particle may be formed with a size of about 7 nm below a position where the electron beam is projected. For example, if the focal size of the electron beam is appropriately adjusted, the size of the formed metal nano particles 130 may be accurately controlled.

Additionally, a silicon oxide ($SiO_2$) 140 may be formed as a thin film around the metal nano particles 130, and the description for a principal and a function of the silicon oxide formation will be described with reference to FIGS. 3 and 4. Referring to (e) of FIG. 2, an insulation layer 150 may be formed on the floating gate 120 where the metal nano particles 130 is formed. The insulation layer 150 may be formed of silicon oxide ($SiO_2$) and this insulation layer 150 may serve to prevent or reduce electrons trapped in the metal nano particles 130 from leaking toward the gate.

Referring to (f) of FIG. 2, a portion of the floating gate 120 and the insulation layer 150 on the semiconductor substrate 110 may be removed. Removing the portion of the floating gate 120 and the insulation layer 150 may precede as a pre-step for forming a source region 112 and a drain region 114 in (g) of FIG. 2. The removed portion may correspond to portions where the source region 112 and the drain region 114 will be formed in the semiconductor substrate 110. For this partial removal process, a predetermined or given masking process may be preceded, and various etching methods including dry etching may be used for the removal process without restriction.

Referring to (g) of FIG. 2, the source region 112 and the drain region 114 may be formed at each predetermined or given portion of the semiconductor substrate 110. For example, if a P-type substrate is used as the semiconductor substrate 110, doping may be performed by implanting ions of Group V elements (e.g., phosphorous (P)) at both sides of the floating gate 120, such that the N-type source region 112 and drain region 114 may be formed.

The doping of ions may be performed by an ion implanting method that compulsorily implants ionized atoms in silicon through acceleration or an implanting method, which implants atoms of a solid or gas state through thermal diffusion. The ion implanting method may be a high energy ion implanting method, a low energy ion implanting method, an ion method controlling the impurity implanted depth through a heavy atom, and a plasma ion implanting method that may be relatively easily used in a small-scale laboratory.

Referring to (h) of FIG. 2, a source electrode 170, a drain electrode 175, and a gate electrode 160 may be formed on the source region 112, the drain region 114, and the metal oxide thin layer 210, respectively. In example embodiments, any material that is used as an electrode material may be used without restrictions, and may be used as the material for the source electrode 170, the drain electrode 175, and the gate electrode 160, and also the same electrode material (e.g., aluminum (Al)) may be used by in view of convenience (e.g., simplification and time reduction of manufacturing processes).

However, in example embodiments, an additional gate electrode 160 may be provided on the metal oxide thin layer 210, but as mentioned above, the metal oxide thin layer 210 (e.g., a ZnO thin layer) itself may function as an electrode. Accordingly, when the metal oxide thin layer 210 is used as the gate electrode 160, an additional forming operation for the gate electrode 160 may be omitted.

If the metal oxide thin layer 210 is used as the gate electrode 160, ions of phosphorus (P) may be implanted on the metal oxide thin layer 210 in order to increase the availability as an electrode by reducing a resistance in the metal oxide thin layer 210. The implanting process of phosphorus (P) may be performed together with (g) of FIG. 2. On the contrary, when the metal oxide thin layer 210 is not used as the gate electrode 160, after removing the remaining metal oxide thin layer 210, the additional gate electrode 160 may be formed on the amorphous metal silicon oxide thin layer.

For example, the gate electrode 160 may be formed after removing the metal oxide thin layer 210 during an etching process in (c) of FIG. 2, for example, different from when the gate electrode 160 is not additionally formed on the remaining metal oxide thin layer 210. In example embodiments, the etching process of the metal oxide thin layer 210 may be performed together with (c) of FIG. 2 for manufacturing convenience. However, the etching process may be performed during any middle or later processes including (c) of FIG. 2. However, in example embodiments, the additional gate electrode 160 may be formed while the metal oxide thin layer 210 is not used as an electrode.

Figure 3:
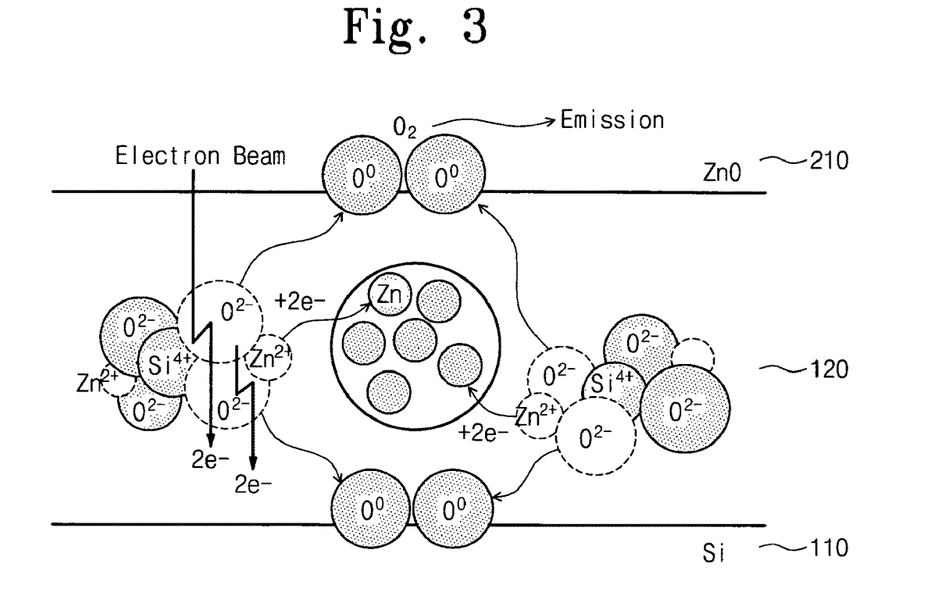
FIG. 3 is a mimetic diagram illustrating a situation when an oxygen atom may be separated from an amorphous metal silicon thin layer to form a metal atom and a silicon oxide according to example embodiments.
Figure 4:
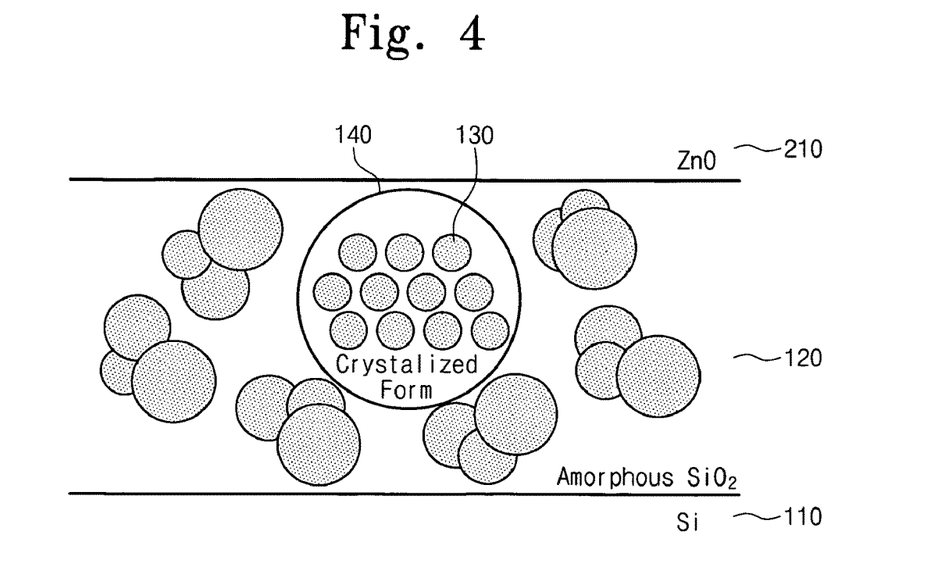
FIG. 4 is a mimetic diagram illustrating a situation when a silicon oxide may be formed around metal nano particles according to example embodiments.

FIG. 3 is a mimetic diagram illustrating a situation when an oxygen atom may be separated from an amorphous metal silicon thin layer to form a metal atom and a silicon oxide according to example embodiments. FIG. 4 is a mimetic diagram illustrating a situation when a silicon oxide may be formed around metal nano particles according to example embodiments. Referring to FIG. 3, when an electron beam is projected on an amorphous metal silicon oxide thin layer, the amorphous metal silicon oxide thin layer (e.g., a $Zn_{2X}Si_{1-Y}O_2$ thin layer) receiving relatively high energy through the electron beam may be separated into a silicon oxide (e.g., $SiO_2$) and a metal oxide (e.g., ZnO), respectively. The electron beam may be the continuous stream of electrons having a uniform emitting speed from an electron gun.

In example embodiments, because the silicon oxide ($SiO_2$) is more stable than the metal oxide (ZnO) in a thermodynamic aspect, the silicon oxide may be formed as before, but the metal oxide may emit oxygen atoms $O^{2-}$ to the external environment and may be deoxidized such that the metal oxide remains as a state of a metal atom (e.g., $Zn^{2+}$). Referring to FIG. 4, the metal atom (e.g., $Zn^{2+}$) may be locally formed on an area where an electron beam is projected, and metal nano particles 130 of a crystallized form may be generated by gathering the metal atoms. Additionally, a silicon oxide ($SiO_2$) 140 may be formed around the metal nano particles 130.

For example, the metal nano particles 130 formed by the electron beam may have a structure surrounded by an insulation layer. The metal nano particles 130 surrounded by the insulation layer may have improved electron trapping ability because less electrons trapped in the metal nano particles 130 may be emitted when a voltage is not applied to the amorphous metal silicon oxide thin layer. If metal nano particles 130 are used during the manufacture of the flash memory device according to example embodiments, more improved electrical characteristic and information storage ability may be achieved.

Figure 5:
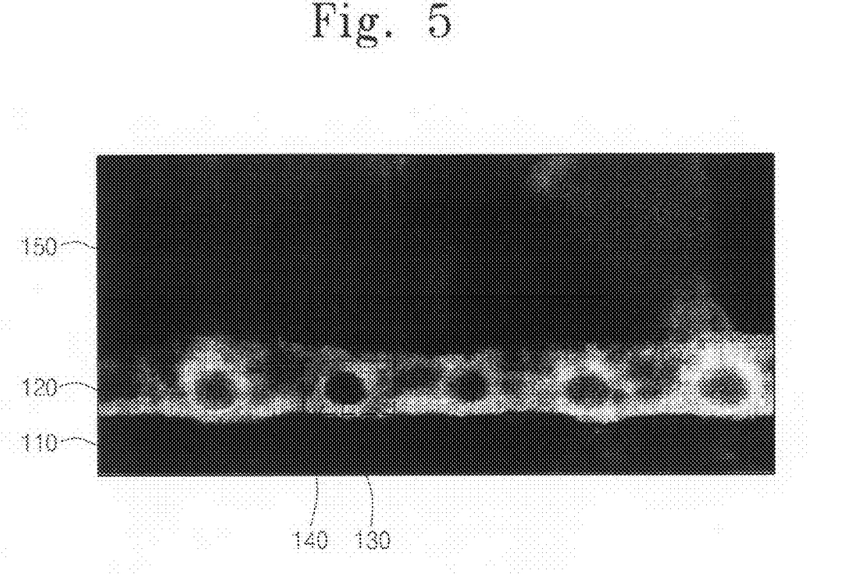
FIGS. 5 and 6 are pictures of metal nano particles formed in an amorphous metal silicon oxide thin layer, taken by a transmission electron microscope according to example embodiments.
Figure 6:
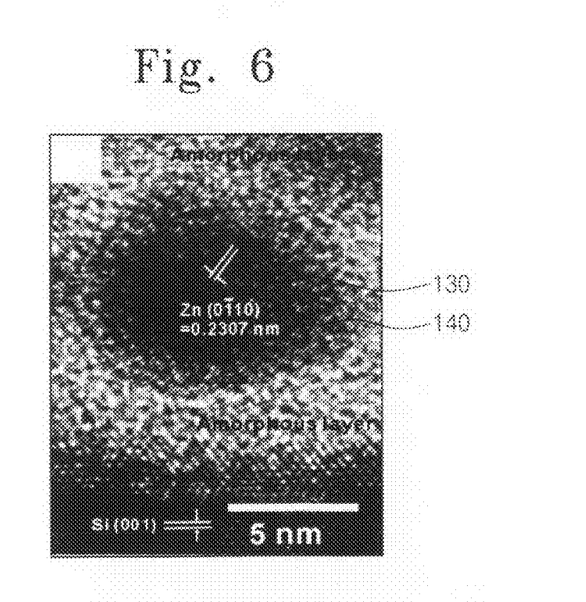

FIGS. 5 and 6 are pictures of metal nano particles formed in an amorphous metal silicon oxide thin layer, taken by a transmission electron microscope according to example embodiments. As illustrated in FIG. 5, the metal nano particles 130 may have a uniform crystallization in the amorphous metal silicon oxide thin layer. FIG. 6 is an enlarged view of a rectangle partitioning the perimeter of the metal nano particles 130 of FIG. 5. Zinc (Zn) particles of about 0.2307 nm constitute the crystalline metal nano particles 130 of about 7 nm.

Additionally, because the focal size of the electron beam is about 7 nm, forming the crystallized size of the metal nano particles 130 according to the focal size means that the targeted size of the metal nano particles 130 may be achieved. Therefore, forming one nano particle with an accurate size due to a refraction characteristic of light may be easier when a typical laser is projected.

Referring to FIG. 5 again, a plurality of metal nano particles 130 may have a relatively uniform distribution in the amorphous metal silicon oxide thin layer. The number and position of the formed metal nano particles 130 may be accurately controlled based on the number and position of the electron beam projection. If the sizes of metal nano particles are uniformly adjusted, the number of electrons trapped in metal nano particles also may be uniformly adjusted. If a device is designed using example embodiments, reproducibility and reliability of the device may be improved because the device having electrical characteristics or the same memory characteristics that a designer plans for may be manufactured.

Figure 7:
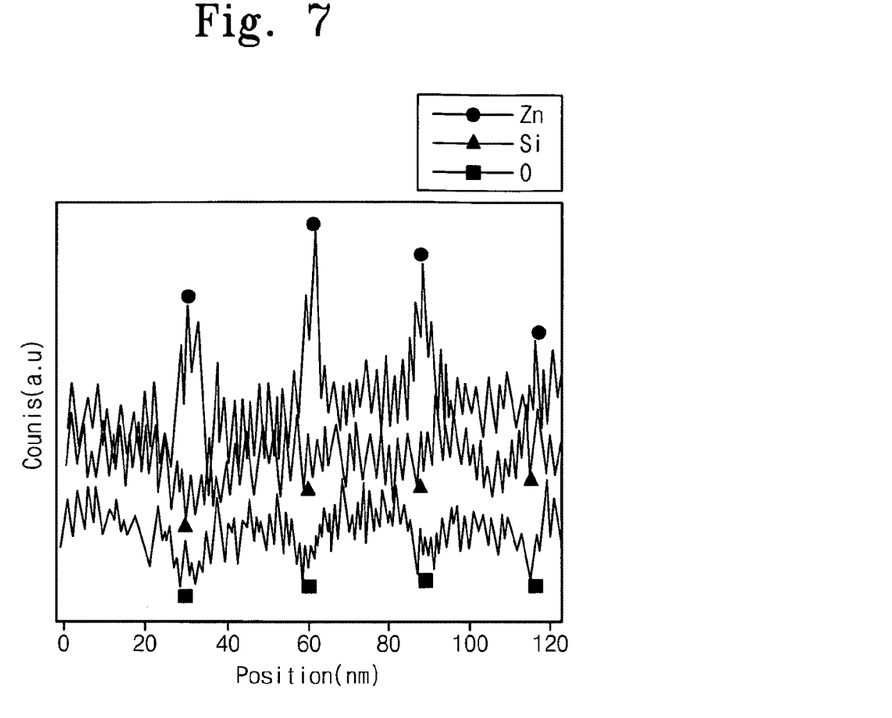
FIG. 7 is a distribution chart of material components of metal nano particles according to example embodiments.

FIG. 7 is a distribution chart of material components of a metal nano particle according to example embodiments. Referring to FIG. 7, as the result of performing an X-ray measurement on each metal nano particle 130 through an energy dispersive X-ray microanalysis (EDS), each metal (e.g., Zn of FIG. 7) nano particle may have almost the same component ratio with respect to other materials. The formed metal nano particle may not be chemically bonded with a peripheral material and may be formed of a nano particle having a pure metal form regardless of positions.

Figure 8:
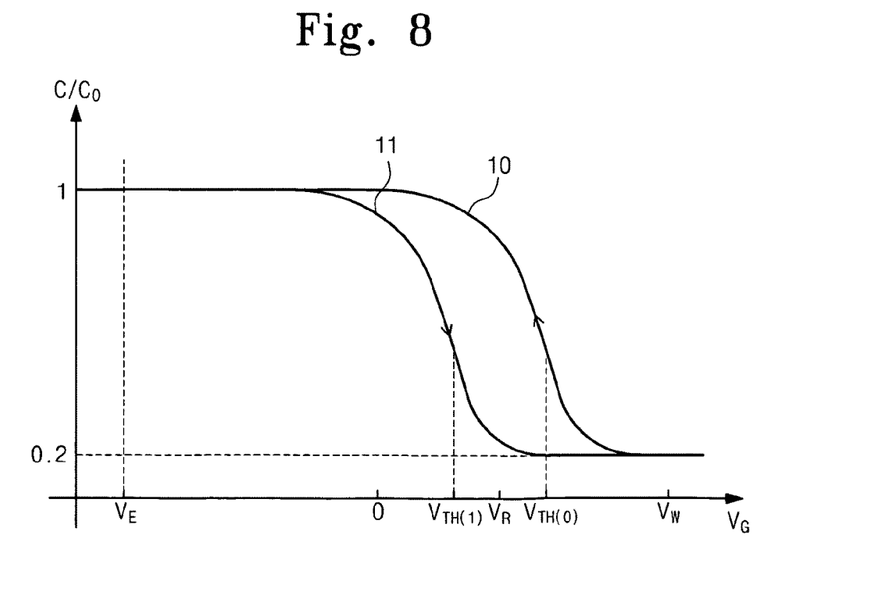
FIG. 8 is a graph illustrating changes of an electric capacity of a floating gate and a threshold voltage of a channel according to a gate voltage applied from a flash memory device of example embodiments.

FIG. 8 is a graph illustrating changes of an electric capacity of a floating gate and a threshold voltage of a channel according to a gate voltage applied from a flash memory device of example embodiments. A gate voltage $V_G$ is a voltage applied between the gate electrode 160 and the semiconductor substrate 110 according to the first voltage source 180 of FIG. 1. Additionally, each ratio ($C_0/C$ where $C_0$ may be the maximum electric capacity value and C may be electric capacity according to an applied voltage) of the gate voltage $V_G$ and the electric capacity may be shown in the graph of FIG. 8 based on the size of each value. An interval between each value and the size of each value may not be necessarily in a proportional relationship. Additionally, hereinafter, an initial state where there is no electron trapped in the metal nano particles 130 may be defined as '1', and otherwise, may be defined as '0'.

A relationship between an applied gate voltage and electric capacity accumulated in the floating gate 120 when a predetermined or given gate voltage may be applied to the flash memory device of example embodiments shows a hysteresis curve characteristic. For example, when a write voltage $V_W$ is applied to a device, electric capacity accumulated in the floating gate 120 of the flash memory device may be increased along a first curve 10, and when an erase voltage $V_E$ is applied to a device, the electric capacity of the floating gate 120 may be reduced along a second curve 11.

In example embodiments, when a write voltage $V_W$ is applied to the device, a threshold voltage $V_{TH}$ of the flash memory device may be increased from a threshold voltage $V_{TH(1)}$ to a threshold voltage $V_{TH(0)}$ in response to a change of the electric capacity of the floating gate 120, and when an erase voltage $V_E$ is applied to the device, the threshold voltage returns may be reduced to the threshold voltage $V_{TH(1)}$. The threshold voltage $V_{TH(1)}$ means a threshold voltage of a device at a state '1' (e.g., an initial state) and the threshold voltage $V_{TH(0)}$ means a threshold voltage of a device at a state '0'.

Figure 10:
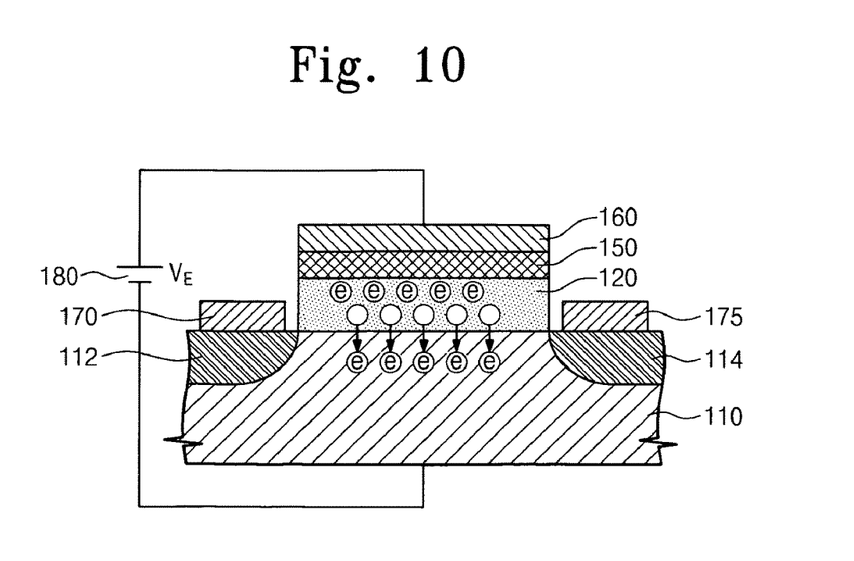
FIG. 10 is a view illustrating a principal of an erase operation in a flash memory device according to example embodiments.

FIG. 9 is a view illustrating a principal of a write operation in a flash memory device according to example embodiments. FIG. 10 is a view illustrating a principal of an erase operation in a flash memory device according to example embodiments. Referring to FIG. 9, the principal of the write operation of the flash memory device will be described as follows. A predetermined or given size of a gate voltage (e.g., a write voltage $V_W$) having a positive value may be applied between the gate electrode 160 and the semiconductor substrate 110 in order to memorize (e.g., write) a state '0' in the flash memory device.

In example embodiments, the drain electrode 175 may be electrically cut off from the source electrode 170 in order to perform a write operation. The gate voltage having a positive value means that an anode may be connected to the gate electrode 160, and a cathode may be connected to the semiconductor substrate 110. On the contrary, the gate voltage having a negative value means that a cathode may be connected to the gate electrode 160, and an anode may be connected to the semiconductor substrate 110.

In example embodiments, when the write voltage $V_W$ is applied to the device, an inversion layer may be formed in an intermediate region of the semiconductor substrate 110 due to the accumulation of an electrode. Additionally, an external field may be formed toward the semiconductor substrate 110. In example embodiments, an electrode accumulated in the inversion layer may receive an attractive force in an opposite direction to the formed external field, and due to this attractive force, the electrode may tunnel through the tunnel insulation layer 150 and the floating gate 120 and thus may be trapped by the metal nano particles 130 distributed in the amorphous metal silicon oxide thin layer. In example embodiments, applying a gate voltage in order to trap an electron in the metal nano particles 130 distributed in the floating gate 120 corresponds to a write operation of a state '0' in the flash memory device.

In example embodiments, by the electrode trapped in the metal nano particles 130, an internal field may be formed (induced) toward the gate electrode 160 in the device. Due to the influence of this internal field, a relationship between electric capacity and a voltage at a state '0' shows hysteresis characteristics like the first curve 10 of FIG. 8. For example, the threshold voltage of the device may rise from the threshold voltage $V_{TH(1)}$ of an initial state to the threshold voltage $V_{TH(0)}$. The principal of the erase operation of the flash memory device will be described with reference to FIG. 10. In order to remove (erase) a memory state of the flash memory device, a predetermined or given size of a gate voltage (e.g., an erase voltage $V_E$) having a negative value between the gate electrode 160 and the semiconductor substrate 110 may be applied.

In example embodiments, when the erase voltage $V_E$ is applied to the device, an external field may be formed in a direction from the semiconductor substrate 110 toward the gate electrode 160. In example embodiments, an electron trapped in the metal nano particles 130 may receive an attractive force in an opposite direction to the formed external field, and due to this attractive force, the electron trapped in the metal nano particles 130 may tunnel through the tunnel insulation layer 150 and the floating gate 120, and thus, all of them may be drained (leaked) toward the semiconductor substrate 110.

In example embodiments, applying a gate voltage in order to emit all of the electrons trapped in the metal nano particles 130 and thus return to its original state (e.g., an initial state) corresponds to the erase operation of the flash memory device. Accordingly, when the erase voltage $V_E$ is applied, the device may be initialized again and returns to a state '1'. Because a relationship between electric capacity and a voltage of the device returns to an initial state curve of FIG. 8, the threshold voltage of the device may be decreased to the threshold voltage $V_{TH(1)}$ again.

FIG. 11 is a view illustrating a principal of a read operation of a state '0' in a flash memory device according to example embodiments. FIG. 12 may be a view illustrating a principal of a read operation of a state '1' in a flash memory device according to example embodiments. Referring to FIGS. 11 and 12, besides a read voltage $V_R$ applied by the first voltage source 180, a uniform size of a voltage $V_{DS}$ may be applied between the drain electrode 175 and the source electrode 170, connected through the second voltage source 190, in order to perform a read operation of each memory state in the flash memory device. However, because this is a general drive circuit configuration when a read operation of the flash memory device is performed, its detailed description will be omitted for conciseness.

As illustrated in FIG. 11, if a read voltage $V_R$ is applied during an initial state (a state '1') where there is no electron trapped in the metal nano particles 130 distributed in the floating gate 120, because the read voltage $V_R$ applied to the device has a larger value than the threshold voltage $V_{TH(1)}$ during the initial state, a channel may be formed as a transfer channel in an intermediate region of the semiconductor substrate 110. Accordingly, a current (e.g., a drain current) may flow toward the source region 112 between the source region 112 and the drain region 114 due to the electron transfer through the formed channel.

Example embodiments may determine (read) a memory state of the device by verifying (measuring) whether there is a drain current flowing through the device or not when the read voltage $V_R$ is applied to the device. For example, when the read voltage $V_R$ is applied to the device, if a drain current flows as illustrated in FIG. 11, the device may be in a state '1' where there is no accumulated charge in the floating gate 120 (e.g., there may be no electron trapped in the metal nano particles 130). When a drain current does not flow because there may be no channel formed as illustrated in FIG. 12, the device may be in a state '0' where charge may be accumulated in the floating gate 120 (e.g., there may be an electron trapped in the metal nano particles 130). The read voltage $V_R$ applied to the device may be a larger value than the threshold voltage $V_{TH(1)}$ of an initial state or a smaller value than the threshold voltage $V_{TH(0)}$ of a state '0' as illustrated in FIG. 8.

Example embodiments provide a flash memory device including metal nano particles formed by projecting an electron beam in an amorphous metal silicon oxide thin layer, and a method of fabricating the same. Example embodiments also provide a flash memory device capable of controlling the size, concentration, and position of metal nano particles by appropriately adjusting the size, projection time, and projection position of an electron bean during manufacture of a floating gate, and a method of fabricating the same.

Example embodiments provide a flash memory device including metal nano particles having an improved charge trap ability at its surface because the metal nano particles may be surrounded by an insulation layer, and a method of fabricating the same. Furthermore, a flash memory device may be used in a disk type storage device, and also, a high capacity storage device of a portable electronic device, e.g., mobile phones or PMPs.

The above-disclosed subject matter may be to be considered illustrative, and not restrictive, and the appended claims may be intended to cover all such modifications, enhancements, and other embodiments, which fall within the true spirit and scope of example embodiments. Thus, to the maximum extent allowed by law, the scope of example embodiments may be determined by the broadest permissible interpretation of the following claims and their equivalents, and shall not be restricted or limited by the foregoing detailed description.

What is claimed is:

1. A method of manufacturing a flash memory device, the method comprising:
   forming a metal oxide thin layer on a semiconductor substrate;
   forming a floating gate including an amorphous metal silicon oxide thin layer by performing a thermal treatment process on the semiconductor substrate where the metal oxide thin layer is formed; and
   forming metal nano particles surrounded by a silicon oxide layer in the floating gate by projecting an electron beam on the floating gate,
   wherein the thermal treatment process is performed in an $O_2$ environment.

2. The method of claim 1, further comprising:
   forming a first conductive region and a second conductive region at both sides of the floating gate.

3. The method of claim 2, wherein forming the first and second conductive regions comprises:
   implanting ions of Group V elements on both sides of the semiconductor substrate.

4. The method of claim 3, wherein the Group V element is phosphorous (P).

5. The method of claim 3, wherein the ions are implanted by a high energy ion implanting method, a low energy ion implanting method, an ion method controlling the impurity implanted depth through a heavy atom, or a plasma ion implanting method.

6. The method of claim 1, wherein the amorphous metal silicon oxide thin layer is formed between the semiconductor substrate and the metal oxide thin layer.

7. The method of claim 6, further comprising:
   etching the metal oxide thin layer.

8. The method of claim 6, wherein the amorphous metal silicon oxide thin layer surrounds the silicon oxide layer.

9. The method of claim 6, further comprising:
   a plurality of the silicon oxide layers deposited in the amorphous metal silicon oxide layer, the plurality of the silicon oxide layers being separated by the amorphous metal silicon oxide layer.

10. The method of claim 1, further comprising:
forming an insulation layer on the floating gate.

11. The method of claim 10, further comprising:
forming a gate electrode on the floating gate;
forming a first electrode on the first conductive region; and
forming a second electrode on the second conductive region.

12. The method of claim 1, wherein the metal nano particles being surrounded by the silicon oxide layer are generated by separating the metal nano particles and the silicon oxide layer in the amorphous metal silicon oxide thin layer.

13. The method of claim 1, wherein a metal of the metal nano particles comprises at least one of zinc (Zn), copper (Cu), indium (In), silver (Ag), tin (Sn), antimony (Sb), nickel (Ni), and iron (Fe).

14. The method of claim 1, wherein the size, concentration, and position of the metal nano particles are controlled by respectively adjusting the focal size, projection time, and projection position of the electron beam.

15. The method of claim 1, wherein a thickness of the floating gate is controlled by adjusting the thermal treatment time.

16. The method of claim 1, wherein the amorphous metal silicon oxide thin layer comprises at least one thin layer of $Zn_{2x}Si_{1-y}O_2$, $Cu_{2x}Si_{1-y}O_2$, $In_{2x}Si_{1-y}O_2$, $Ag_{2x}Si_{1-y}O_2$, $Sn_{2x}Si_{1-y}O_2$, $Sb_{2x}Si_{1-y}O_2$, $Ni_{2x}Si_{1-y}O_2$, and $Fe_{2x}Si_{1-y}O_2$.

17. The method of claim 1, wherein the metal oxide thin layer is formed by sputtering, evaporation, molecular beam epitaxy (MBE), ionized cluster beam deposition (ICBD), or a laser deposition method.

18. The method of claim 1, wherein the thickness of the amorphous metal silicon oxide thin layer is about 15 nm-about 20 nm.

* * * * *